(12) United States Patent  
Gaugler et al.

(10) Patent No.: US 8,701,059 B2  
(45) Date of Patent: *Apr. 15, 2014

(54) METHOD AND SYSTEM FOR REPARTITIONING A HIERARCHICAL CIRCUIT DESIGN

(71) Applicant: International Business Machines Corporation, Armonk, NY (US)

(72) Inventors: Elmar Gaugler, Boeblingen (DE); Wilhelm Haller, Boeblingen (DE); Friedhelm Kessler, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/781,904

(22) Filed: Mar. 1, 2013

(65) Prior Publication Data

US 2013/0239075 A1    Sep. 12, 2013

Related U.S. Application Data

(62) Division of application No. 12/831,303, filed on Jul. 7, 2010, now Pat. No. 8,516,417.

(30) Foreign Application Priority Data

Aug. 7, 2009   (EP) .................................... 09167447

(51) Int. Cl.
    *G06F 17/50*    (2006.01)
(52) U.S. Cl.
    CPC .......... *G06F 17/505* (2013.01); *G06F 17/5077* (2013.01); *G06F 17/5081* (2013.01); *G06F 17/5072* (2013.01)

USPC ........... 716/105; 716/108; 716/103; 716/124; 716/125; 716/131

(58) Field of Classification Search
    CPC .............. G06F 17/505; G06F 17/5077; G06F 17/5081; G06F 17/5072
    USPC .................. 716/105, 108, 103, 124, 125, 131
    See application file for complete search history.

(56) References Cited

U.S. PATENT DOCUMENTS 5,384,720 A * 1/1995 Ku et al. .......................... 703/16  
5,416,717 A * 5/1995 Miyama et al. ................. 703/14

(Continued)

OTHER PUBLICATIONS

Quick VLSI CMOS Power Estimator; IBM Technical Disclosure Bulletin; vol. 33, Issue 6A; Nov. 1, 1990; pp. 433-435.

(Continued)

*Primary Examiner* — Phallaka Kik  
(74) *Attorney, Agent, or Firm* — Schmeiser, Olsen & Watts; Richard M. Kotulak

(57) ABSTRACT

The invention relates to a method and a system for repartitioning a formalized hardware description of a hierarchically structured electronic circuit design unit comprising a plurality of macros in terms of latch macros and combinatorial macros. In a first step, each macro is dissected into latch macros and signal cones in such a way that
  each signal cone comprises signals linking macro input/output to a latch output/input, and
  each latch macro comprises at least one latch, each primary input an output of said latch macro coinciding with an input or an output of a latch within said latch macro.
Subsequently, combinatorial macros are created by merging combinatorial signal cones along unit signal paths.

19 Claims, 10 Drawing Sheets

(56) References Cited

U.S. PATENT DOCUMENTS

| | | | |
|---|---|---|---|
| 5,448,493 A * | 9/1995 | Topolewski et al. | 716/117 |
| 5,475,607 A | 12/1995 | Apte et al. | |
| 5,926,398 A * | 7/1999 | Nakamura | 716/122 |
| 5,991,523 A | 11/1999 | Williams et al. | |
| 6,223,326 B1 | 4/2001 | Fields et al. | |
| 6,253,356 B1 * | 6/2001 | Kung | 716/114 |
| 6,421,818 B1 | 7/2002 | Dupenloup et al. | |
| 6,434,704 B1 * | 8/2002 | Dean et al. | 713/320 |
| 6,440,780 B1 * | 8/2002 | Kimura et al. | 438/129 |
| 6,449,759 B1 * | 9/2002 | Whitney et al. | 716/114 |
| 6,463,576 B1 | 10/2002 | Tomoda | |
| 6,518,788 B2 * | 2/2003 | Kasahara | 326/46 |
| 6,536,024 B1 * | 3/2003 | Hathaway | 327/295 |
| 6,557,145 B2 * | 4/2003 | Boyle et al. | 716/105 |
| 6,959,426 B2 | 10/2005 | Xiang et al. | |
| 6,980,211 B2 * | 12/2005 | Lin et al. | 345/440 |
| 7,003,747 B2 | 2/2006 | Zhou et al. | |
| 7,020,589 B1 * | 3/2006 | Datta Ray et al. | 703/2 |
| 7,200,197 B2 * | 4/2007 | Goko | 375/372 |
| 7,299,430 B1 | 11/2007 | McEwen et al. | |
| 7,480,883 B2 | 1/2009 | Correale et al. | |
| 7,962,876 B2 * | 6/2011 | Oh et al. | 716/113 |
| 8,230,377 B1 * | 7/2012 | Fang et al. | 716/124 |
| 8,302,056 B2 * | 10/2012 | Gaugler et al. | 716/119 |
| 8,428,928 B1 * | 4/2013 | McGaughy | 703/14 |
| 8,516,417 B2 | 8/2013 | Gaugler et al. | |
| 8,549,447 B2 * | 10/2013 | Eisenstadt | 716/100 |
| 2001/0010090 A1 * | 7/2001 | Boyle et al. | 716/2 |
| 2002/0029361 A1 * | 3/2002 | Kasahara | 714/726 |
| 2003/0222872 A1 * | 12/2003 | Lin et al. | 345/440 |
| 2004/0210862 A1 * | 10/2004 | Igarashi et al. | 716/13 |
| 2005/0086621 A1 | 4/2005 | Matsumura et al. | |
| 2005/0251775 A1 | 11/2005 | Wood | |
| 2005/0278676 A1 * | 12/2005 | Dhanwada et al. | 716/9 |
| 2006/0117281 A1 | 6/2006 | Nikitin et al. | |
| 2007/0083835 A1 * | 4/2007 | Endres et al. | 716/6 |
| 2007/0106965 A1 * | 5/2007 | Ohta et al. | 716/2 |
| 2008/0072191 A1 | 3/2008 | Chang et al. | |
| 2008/0127000 A1 | 5/2008 | Majumder et al. | |
| 2008/0201678 A1 * | 8/2008 | Ang et al. | 716/8 |
| 2008/0216040 A1 * | 9/2008 | Furnish et al. | 716/10 |
| 2008/0301593 A1 * | 12/2008 | Jiang et al. | 716/2 |
| 2009/0030665 A1 * | 1/2009 | Kerns et al. | 703/14 |
| 2009/0032903 A1 | 2/2009 | Correale et al. | |
| 2009/0125766 A1 | 5/2009 | Safarpour et al. | |
| 2009/0254874 A1 * | 10/2009 | Bose | 716/6 |
| 2010/0037198 A1 * | 2/2010 | Keinert et al. | 716/17 |
| 2011/0012260 A1 * | 1/2011 | Tokunaga et al. | 257/738 |
| 2011/0035711 A1 | 2/2011 | Gaugler et al. | |
| 2011/0035712 A1 | 2/2011 | Gaugler et al. | |
| 2012/0151431 A1 * | 6/2012 | Huijbregts et al. | 716/131 |
| 2012/0278783 A1 * | 11/2012 | Nikitin et al. | 716/129 |
| 2013/0283225 A1 * | 10/2013 | Alpert et al. | 716/122 |

OTHER PUBLICATIONS

Office Action (Mail Date Mar. 16, 2012) for U.S. Appl. No. 12/831,303, filed Jul. 7, 2010; Confirmation No. 2180.

Amendment filed Sep. 25, 2012 in response to Office Action (Mail Date Mar. 16, 2012) for U.S. Appl. No. 12/831,303, filed Jul. 7, 2010; Confirmation No. 2180.

Office Action (Mail Date Jan. 2, 2013) for U.S. Appl. No. 12/831,303, filed Jul. 7, 2010; Confirmatiion No. 2180.

Amendment filed Apr. 1, 2013 in response to Office Action (Mail Date Jan. 2, 2013) for U.S. Appl. No. 12/831,303, filed Jul. 7, 2010; Confirmation No. 2180.

Notice of Allowance (Mail Date Apr. 18, 2013) for U.S. Appl. No. 12/831,303, filed Jul. 7, 2010; Confirmation No. 2180.

* cited by examiner

METHOD AND SYSTEM FOR REPARTITIONING A HIERARCHICAL CIRCUIT DESIGN

RELATED APPLICATIONS

This application is a division of U.S. patent application Ser. No. 12/831,303, now U.S. Pat. No. 8,302,056, filed on Jul. 7, 2010.

FIELD OF THE INVENTION

The invention relates generally to the design of high-performance digital integrated circuits. Specifically, the invention provides a method for repartitioning a hierarchical representation of a digital integrated circuit in such a way as to simplify assertion based verification of the circuit's timing behavior.

BACKGROUND

In the development process of digital electronic circuits, assertion-based verification is an effective methodology commonly used for verification of a custom circuit design, i.e. for validating correct operation and usage of the design and in particular verifying timing requirements. Based on a hierarchical description of the design under consideration, assertion-based verification involves defining properties which specify the expected behavior of the design and checking the assertion of these properties by simulation. By definition, a hierarchical description of the circuit design encompasses a top level, such as an electronic design unit, which splits into several substructures (instances). Substructures can be instantiated multiple times and in different levels of a hierarchy. A macro is an instance which contains active elements such as NAND, NOR, inverter gates etc.

In the process of integrated circuit development, the design of the electronic circuit to be developed is generally laid out by a logic designer. The logic designer defines the specific implementation of a desired function, partitions this function into logically coherent chunks, so-called macros, and defines primary input and output pins of these macros. In this context, the term "macro" is used to denote a design of a logic function on a chip and specifies the interconnection of the required logic elements as well as the physical pathways and wiring patterns between the components. In order to reflect the hierarchical structure of a design unit in terms of macros, the design is typically described in terms of a hierarchical netlist or in terms of a hardware description language such as hierarchical VHDL. Specifically, the macros proper may be described in macro VHDL, whereas the connectivity of the macros within the unit may be described in unit VHDL.

While the logic designer's partition of the function into macros lends itself very well for functional understanding and simulation, it is generally not well suited for simulating and verifying the timing behavior of the design. For carrying out timing validation, timing requirements are imposed on the various paths of the design under consideration, based on a latch-to-latch cycle time which is to be met by the electronic circuit. If the timing properties of the design are to be checked using assertion based verification, a timing tool associates required arrival times (RATs) with all combinatorial logic located between latches. If there are multiple combinatorial logic elements residing between latches, the timer distributes the cycle time between these logic elements based on timing rules and applied algorithms. After assigning RATs to all paths within the unit under consideration, actual arrival times (ATs) are calculated by using a timing tool. If the difference between the required arrival time and the actual arrival time (slack=RAT−AT) is found to be much larger than zero, the corresponding path can easily achieve the timing requirement. On the other hand, if slack along a path is found to be smaller than zero, this indicates that timing requirements as specified by the RATs cannot be met. In this case, RATs have to be assigned in a different way and/or the actual design implementation has to be modified. While RATs can usually be estimated quite well for paths of low complexity, more complicated paths (i.e. paths which cross two or more macros in a cycle) usually require a number of iteration and laborious manual interaction in order to succeed. Thus, the generation of timing assertions within a design typically encompasses numerous iterations requiring complicated manual manipulations by the logic designer as well as the timer.

In order to reduce the time and effort required for generating valid timing assertions in an electronic design unit, it would be desirable to have a hierarchical description of the design unit under consideration that lends itself to automatic generation of timing assertions. This description should allow automatic assignment of required arrival times (RATs) to the paths within the unit in such a way that minimal manual interference is required.

In the past, attempts have been made to provide tools and methods for simplifying and reducing the manual efforts involved in generating timing assertions (see, for example U.S. Pat. No. 5,475,607 A and U.S. Pat. No. 7,003,747 B2). However, none of these developments have yielded a method that lends itself for automatic generation of timing assertions in general multilevel hierarchical circuit design.

Thus, there is a need for a method that reparations a general multilevel hierarchical circuit design in such a way that timing assertions may be generated with a reduced number of iterations and manual inputs, thus increasing the degree of automation of the generating process.

BRIEF SUMMARY

It is an object of the invention to provide a method and a system for repartitioning a general multilevel hierarchical circuit design in such a way that timing assertions may be generated with a reduced number of iterations and manual inputs.

These objectives are achieved by the features of the independent claims. The other claims and the specification disclose advantageous embodiments of the invention.

According to a first aspect of the invention, a method for repartitioning a multilevel hierarchical description of a design unit comprising a plurality of macros is provided. In this method, the design unit is repartitioned into a set of combinatorial macros and a set of latch macros such that each combinatorial macro contains only combinatorial logic and each latch macro contains one or several latches connected in such a way that each primary input PI and output PO of said latch macro coincides with an input or an output of a latch within said latch macro. In this repartitioned description of the design unit, all inputs and outputs of both the combinatorial macros and the latch macros thus constructed have default assertions which makes the generation of timing assertions very simple.

According to a second aspect of the invention, a method for repartitioning a hierarchical description of a design unit comprising a plurality of macros in terms of latch macros and combinatorial macros is provided. The method comprises the steps of (1) dissecting each macro into latch macros and signal cones; each signal cone comprises signals linking macro input/output to a latch output/input; each latch macro comprises at least one latch and each primary input an output of said latch macro coincides with an input or an output of a latch within said latch macro; and (2) creating combinatorial macros by merging combinatorial signal cones along unit signal paths.

According to a third aspect of the invention, a system for generating and verifying timing assertions for an electronic circuit design is provided. The system comprises (1) a reparation system for generating a repartitioned design unit in terms of latch macros and combinatorial macros and (2) a timing system for generating timing assertions on the repartitioned design unit).

Advantageously, the method of the invention makes use of a hierarchical design description in terms of VHDL or of Verilog. Alternatively, the invention may set out from a hierarchical and complete netlist description of the design.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in.

Figure 1:
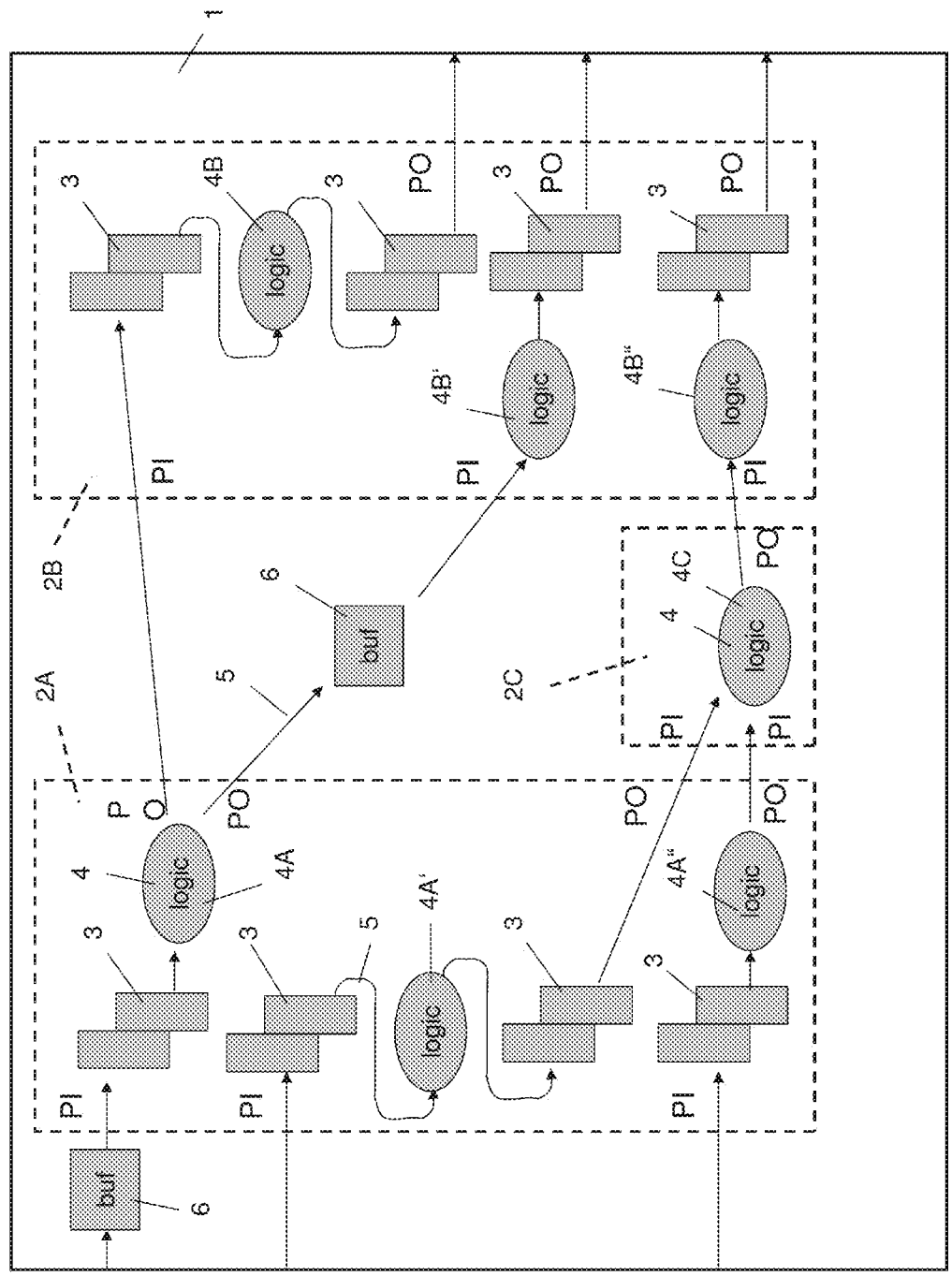
FIG. 1 is a schematic representation of an electronic design unit comprising three macros.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION OF EXAMPLE EMBODIMENTS

During electronic design of complex functions, a logic designer typically describes the desired function in terms of a hierarchical description, for example in a hardware description language such as VHDL or Verilog. In this hierarchical description, the electronic design unit representing the desired function is made up of substructures (macros) each of which may contain multiple subfunctions. Based on this hierarchical description, an automatic tool (Random Logic Macro tool RLM) may generate (synthesize) a physical electronic layout corresponding to the logic structure of the electronic design unit. If automatic synthesis does not yield a satisfactory result, it may be supplemented or replaced by manual placement and routing by a custom designer.

FIG. 1 shows a schematic representation of a hierarchical description (e.g. a VHDL description) of an electronic design unit 1 (e.g. a functional unit or microprocessor). Unit 1 comprises three macros 2 denoted by 2A, 2B and 2C. Macro 2C contains only combinatorial logic generally labeled with numeral 4, whereas macros 2A and 2B comprise combinatorial logic 4 as well as latches 3. Note that in the context of this description, the term "latch" is used as a synonym for a storage device (flip flop) inside a macro. More generally, the term "latch" is also used to denote storage devices comprising a small amount of logic at the input and/or at the output, such as a receiving inverter and/or a driving inverter.

Combinatorial logic 4 within macro 2A is denoted by 4A, 4A' and 4A", whereas combinatorial logic 4 within macro 2B is denoted by 4B, 4B' and 4B". Primary inputs and primary outputs of the macros 2 are indicated by PI and PO. Signal paths along wiring 5 inside the macros 2 as well as between macros 2 are indicated by arrows. Note that specifics of the wiring 5 (such as the wiring level etc.) as well as buffering 6 (as implemented by a unit integrator during routing of the design 1) are not defined in VHDL description but are specified by a unit integrator.

Timing behavior of the electronic design unit 1 may be simulated and verified by a technique called assertion based verification. Based on a predetermined latch-to-latch cycle time, required arrival times (RAT) are assigned to all primary inputs and outputs PI, PO within the unit 1. Subsequently, actual expected arrival times (AT) are calculated using a timing tool. Each of these actual arrival times (AT) is compared to the corresponding required arrival time (RAT); the difference between the required arrival time and the actual arrival time (RAT−AT) is called slack. Whenever the slack is smaller than zero, this indicates a timing problem. On the other hand, if slacks are found to be substantially larger than zero, this indicates that cycle time is wasted and that the timing of the unit may be improved. In both cases, the unit design is readjusted in order to obtain valid and economic timing behavior of the unit 1. This is an iterative process which requires manual interference and is very time consuming.

Figure 2:
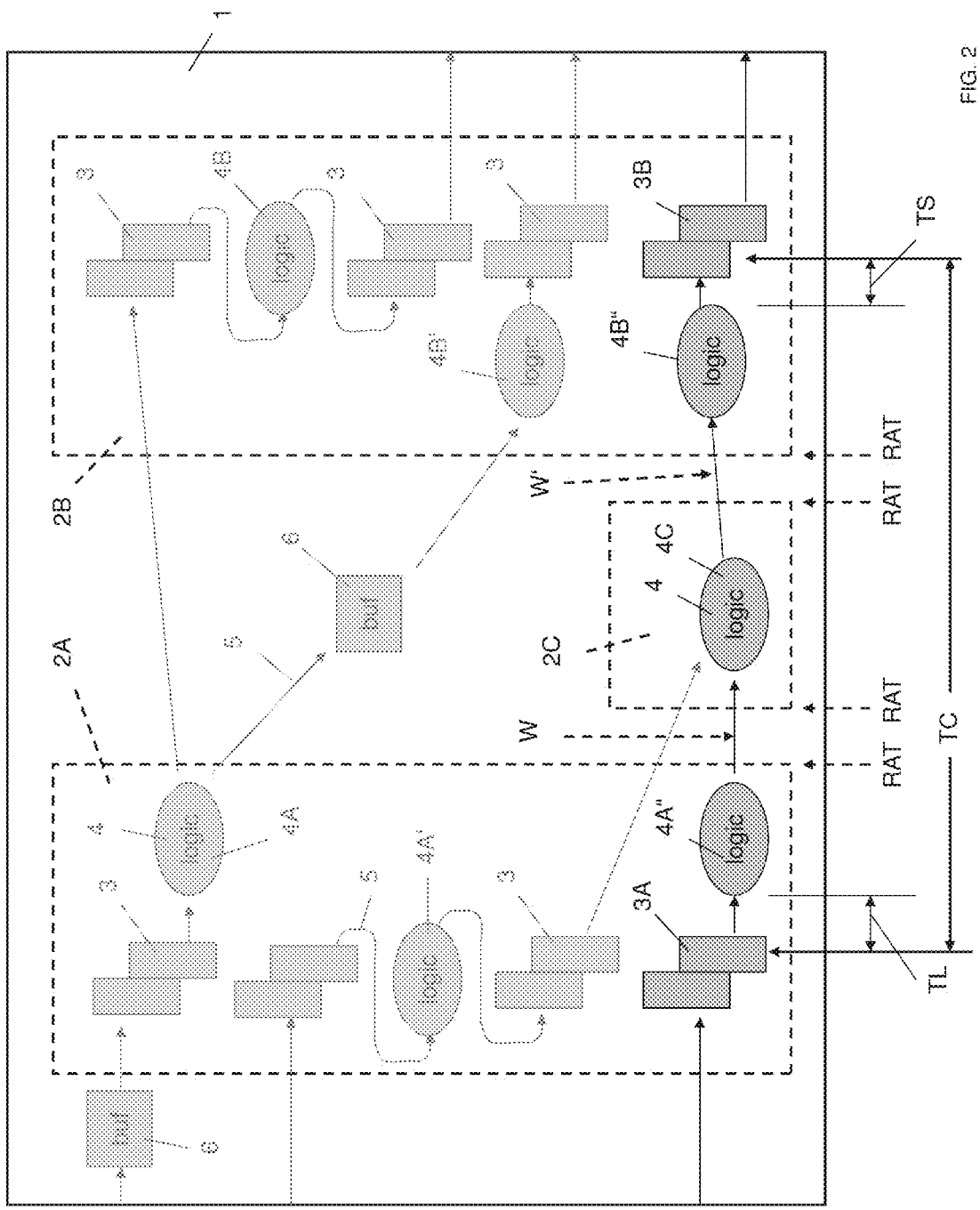
FIG. 2 is a schematic representation of timing assertions along a signal path of the electronic design unit of FIG. 1.

As an example, consider the path from latch 3A in macro 2A to latch 3B in macro 2B (see FIG. 2). Assume that the cycle time is set to the value TC, meaning that a signal exiting latch 3A at a given time must reach latch 3B within the time period TC afterwards. Launch time TL of latch 3A and setup time TS of latch 3B have to be subtracted from the cycle time TC, leaving a transfer time TT=TC−TL−TS for the signal to traverse combinatorial logic 4A", 4C and 4B" as well as all wiring 5 occurring on the path between the latches 3A and 3B. The transfer time TT is apportioned between the elements (logic and wiring) along the signal path, so that required arrival times (RAT) are assigned to the exits and entries from/into macros 2A, 2C and 2B, taking into account wiring delays W, W' between macros 2A and 2C and between macros 2C and 2B, respectively. RATs can be estimated based on timing rules (nominal delay rules NDRs) for each macro 2 as established during synthesis of this macro 2. Having assigned RATs to the macros 2, timing simulations are carried out over the unit 1, and actual arrival times (AT) for all macro exits and entries are calculated. As part of unit timing, signal travel times are integrated over all macros 2 within unit 1. If slack=RAT−AT is found to be negative, RATs apportionment along the respective signal path has to be readjusted and/or macros and wiring along this path have to be modified in order to satisfy timing requirements. Note that even a small modification within a macro and/or a modification of wiring thus may lead to considerable changes in the timing behavior of unit 1, requiring considerable modification of the RAT apportioning along signal paths. Thus, particularly for paths crossing two or more macros 2, generating good assertions is an iterative process which requires manual interaction and is very time consuming; typically, it involves dozens or even hundreds of iterations.

The process of generating timing assertions can be made much more efficient if the macros 2 of the unit 1 under consideration are analyzed, split and regrouped so as to make the connections between the latches 3 more transparent. This is accomplished by repartitioning the original macro structure of unit 1 by identifying all macros 2A, 2B containing latches 3,
identifying signal cones linking macro primary inputs and outputs PI/PO to latches 3, stripping these macros 2A, 2B of all combinatorial logic 4A, 4A", 4B', 4B" and wiring 5' located along these signal cones, thus generating so-called latch macros 12, and
based on macro connectivity, merging the cut-off combinatorial logic 4A, 4A", 4B', 4B" and wiring 5', potentially combining them with additional logic 4C, into so-called combinatorial macros 13,
thus generating a repartitioned unit V. As the macros 2A, 2B are stripped of combinatorial logic 4A, 4A", 4B', 4B" and wiring 5' located between latches 3 and macro inputs/outputs, all primary inputs (PI) of the latch macros 12 thus constructed coincide with inputs (LI) of latches 3 within this latch macro 12 and all primary outputs (PO) of the latch macro 12 coincide with outputs (LO) of latches 3 within this latch macro 12.

Figure 3:
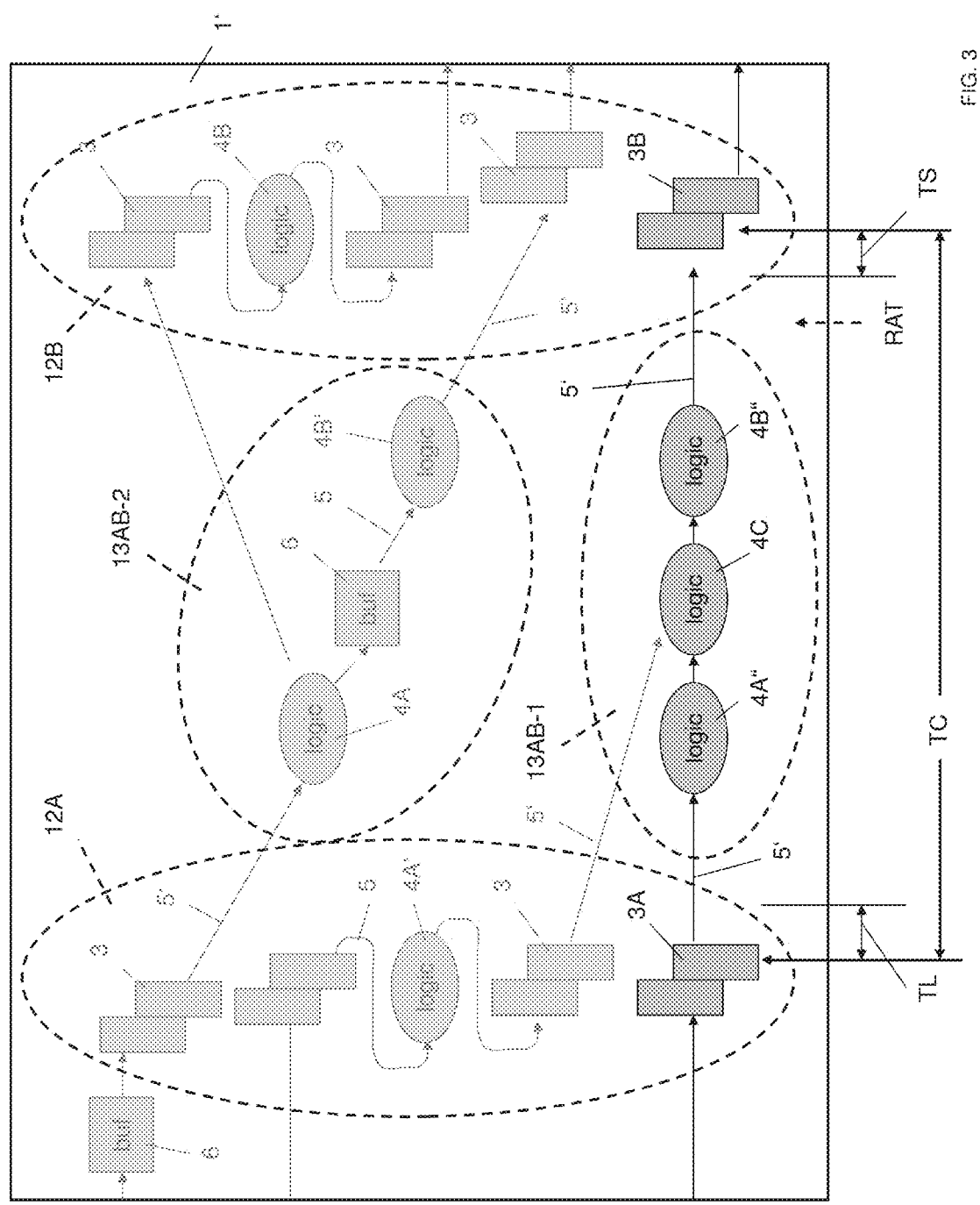
FIG. 3 is the electronic design unit of FIG. 1 after repartitioning the original macro structure in terms of latch macros and combinatorial macros.

FIG. 3 shows the result of this repartitioning for the electronic design unit 1 of FIGS. 1 and 2. As can be seen, two latch macros 12A and 12B, are identified (shown as hashed ovals in FIG. 3), each of them containing four latches 3 as well as combinatorial elements 4A', 4B interleaved between the latches 3, respectively. These latch macros 12A, 12B are generated from original macros 2A, 2B by stripping off combinatorial logic 4A, 4A", 4B', 4B" and wiring 5' located along signal cones linking the macros' 2A, 2B primary input/output PI/PO to the macros' latches 3. Subsequently, these detached parts of combinatorial logic 4A, 4A", 4B', 4B" and wiring 5' located along signal paths are merged with additional combinatorial logic (such as logic 4C) that may be located on signal paths between macros. In the example of FIG. 3, combinatorial logic 4A" detached from original macro 2A is merged with combinatorial logic 4C of original macro 2C and combinatorial logic 4B" of original macro 2B to form a combinatorial macro 13AB-1, the notation indicating that this combinatorial macro 13 is located between latch macros 12A and 12B. Also, combinatorial logic 4A of original macro 2A is merged with combinatorial logic 4B' of original macro 2B to yield a combinatorial macro 13AB-2. Thus, original macros 2A-2C are disintegrated and regrouped into a new unit 1' macro structure containing latch macros 12A, 12B and combinatorial macros 13AB-1 and 13AB-2. Based on this new macro structure, a new VHDL description of the unit 1' is generated, and logic equivalence to the original description is established.

Note that the inputs and outputs of the new macros 12A, 12B, 13AB-1 and 13AB-2 thus created have all default assertions. This is also true for macro internal paths such as paths originating from a latch output, traversing internal combinatorial logic and terminating in a latch input. The start and end points of a clock cycle are defined by the latches, and paths between latches are easy to handle for timing calculations since they contain only one—albeit composite—chunk of combinatorial logic, namely the combinatorial macro 13. When generating timing assertions, required arrival times (RATs) are thus uniquely defined by latch launch or setup times TL, TS. In the example of FIG. 3, subtracting the fixed latch launch time TL and setup time TS from cycle time TC yields a period (transfer time) TT=TC−TL−TS available for signals traversing combinatorial macro 13AB-1. Likewise, the same time period TT is determined for signals traversing combinatorial macro 13AB-2. Thus, no manual optimization of timing assertions is required, and the tedious and time-consuming steps of iteratively generating timing assertions can be eliminated. Instead, the repartitioning of the original macro structure of unit 1 in terms of latch macros 12 and combinatorial macros 13 allows an automatic generation of timing assertions. Required arrival times (RATs) may be estimated from nominal delay rules (NDRs) determined for the newly generated combinatorial macros 13AB-1, 13AB-2. Subsequently, actual arrival times (ATs) of signal traversing unit 1 are computed based on the repartitioned VHDL description of unit 1, including the newly redesigned macros 12A, 12B, 13AB-1, 13AB-2. Slack between RAT and AT is calculated, yielding information on signal paths failing to meet timing requirements, so that logic and/or wiring located along this signal path may be modified. Incidentally, the repartitioned VHDL description may be used to judge the quality of the logic design of unit 1: if the combinatorial macros 13 generated from the original macro 2 structure are found to be overly complex, this may indicate that the logic design of unit 1 lacks clarity.

If the latch is "cladded" in the sense that it comprises small amounts of logic (such as a receiving inverter and/or a driving inverter) at the input and/or at the output of the storage device proper, this logic has a fixed delay and adds a constant value to latch setup time TS and latch launch time TL, but keeps the default assertions at a predefined value.

Note that while the reparation of the design unit 1 in terms of combinatorial macros 13 and latch macros 12 greatly facilitates the generation of timing assertion, it still preserves the hierarchical latch structure and thus gives logic designers as well as unit integrators considerable freedom of action. This is important e.g. for vertical or horizontal orientation of data flow, structure of latches to improve clock wiring etc.

A preferred embodiment of a method 100 for repartitioning a macro structure of an electronic design unit 21 with macros 22 in terms of latch macros 32 and combinatorial macros 33 will now be explained in more detail in conjunction with FIGS. 4 to 9. Note that method 100 can in fact be applied to any hierarchical design structure, i.e. any design structure with a top level which is split into several substructures (instances). Note also that there may be multiple hierarchical levels of instances. Thus, the subsequent description of the method in terms of a design unit 21 comprising macros 22 serves merely as a specific implementation of a more general hierarchical design structure.

Figure 5:
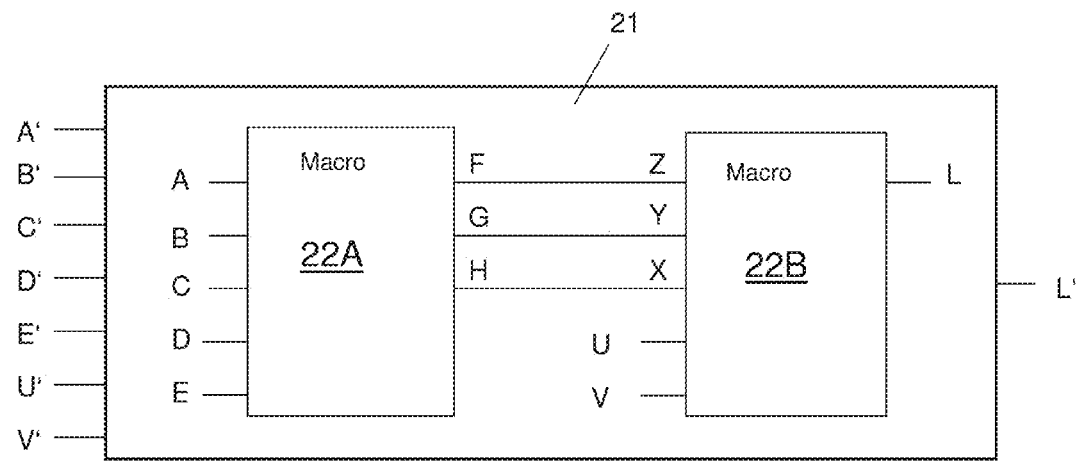
FIG. 5 is a schematic representation of an alternate electronic design unit comprising two macros 22A, 22B.

FIG. 5 shows an electronic design unit 21 with primary inputs (PI) labeled A', B', C', D', E', U', V' and one primary output (PO) labeled L'. In this example, unit 21 represents the top level and comprises two macros 22A and 22B as substructures; each macro 22A, 22B may comprise further substructures. Macros 22A and 22B may be depicted in detail in FIGS. 6A and 6B respectively. Macro 22A comprises a total of eight latches 3 as well as a variety of combinatorial logic elements 4 and primary inputs (PI) A, B, C, D, E as well as primary outputs (PO) F, H, G. Signals entering the PIs and exiting the POs of macro 22A are denoted by a, b, c, d, e and f, g, h respectively. Macro 22B comprises a total of three latches 3, various combinatorial logic elements 4 and primary inputs (PI) U, V, X, Y, Z as well as primary outputs (PO) L. Signals entering the PIs and exiting the POs of macro 22B are denoted by u, v, x, y, z and l respectively. Signals originating from macro 22A and terminating in macro 22B may be renamed into unique common names, so that signals f and z may be merged into f_z, g and y may be merged into g_y and h and x may be merged into h_x.

Figure 4A:
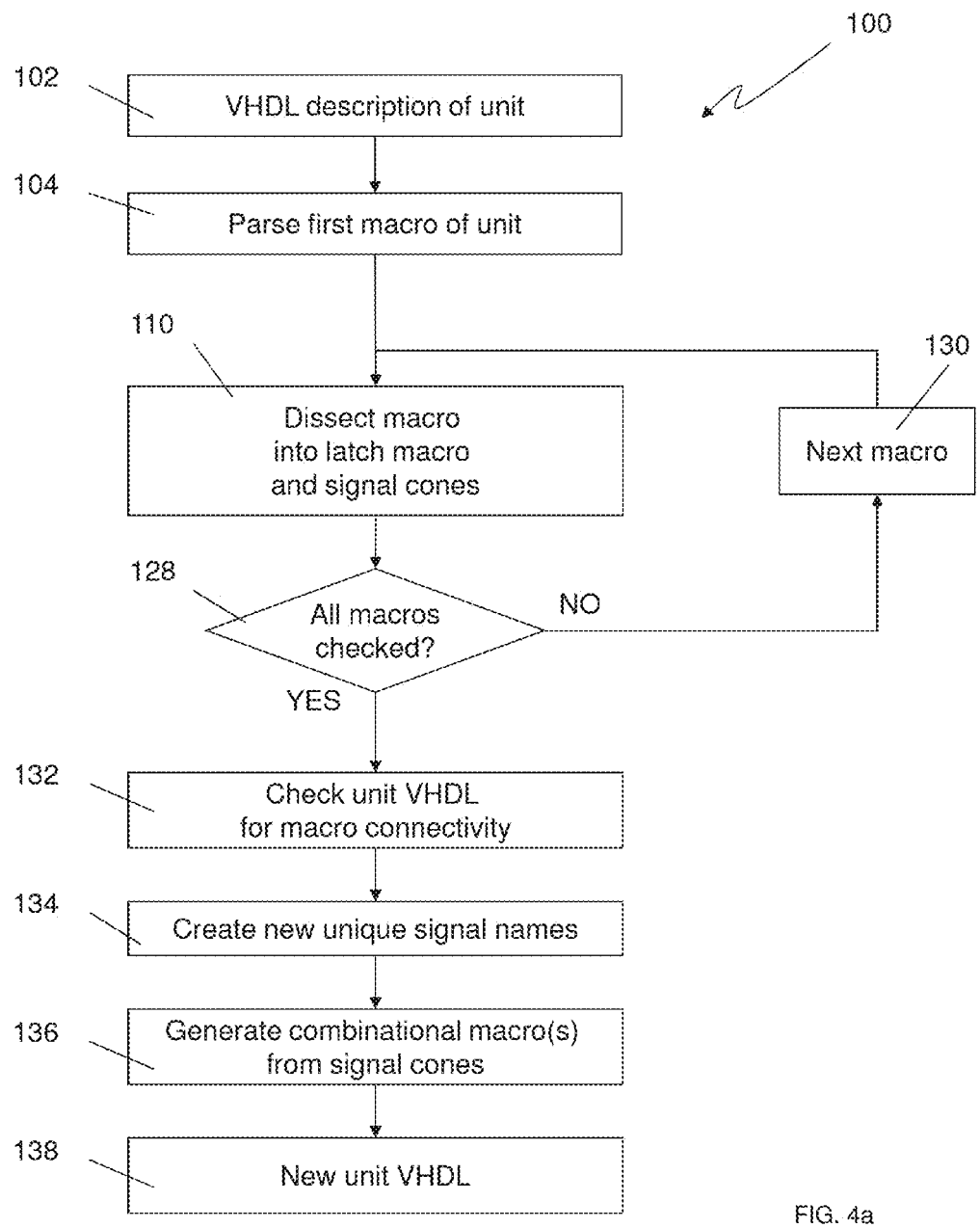
FIG. 4A is a schematic flow diagram of a method for repartitioning a hierarchical representation of an electronic design unit in terms of latch macros and combinatorial macros.
Figure 4B:
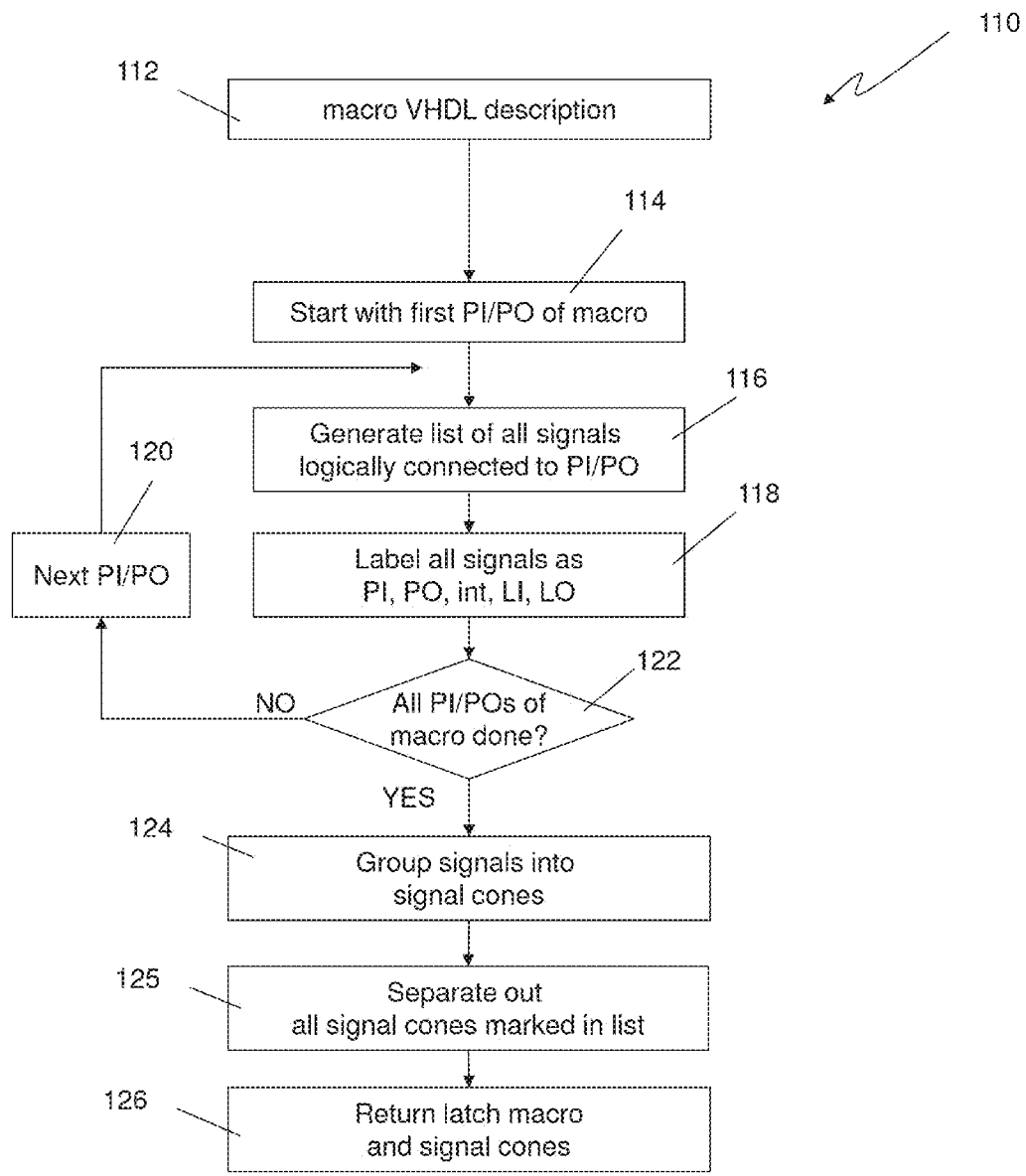
FIG. 4B is a schematic flow diagram of step 110 of FIG. 4A.

A schematic flow diagram of a preferred embodiment of method 100 for repartitioning macros 22A, 22B in terms of latch macros 32 and combinatorial macros 33 is shown in FIGS. 4a and 4b. Method 100 is shown to set out from a VHDL description of the design unit 21 under consideration (step 102); more generally, method 100 could set out from any hierarchical representation of the design unit 21 in terms of a formalized hardware description language, e.g. a Verilog description or an RTL description.

When executing method 100, the macro VHDL descriptions of all macros 22 of unit 21 are parsed one by one (loop 130), and each macro 22 is dissected into (at most) one latch macro 32 and one or multiple signal cones 34 (step 110). Assume that macro 22A is processed first (step 104). Dissecting step 110 of macro 22A begins by identifying primary inputs and outputs PI/PO of macro 22A. These inputs and outputs are investigated and classified one by one (loop 120). As part of this loop 120, a specific primary input or output of macro 22A, say primary input A, is selected (step 114), and a list of all signals logically connected to this primary input A is generated (step 116). This is accomplished by tracing through the various logic functions 4 located between input A and latch 3 and collecting all signals encountered. In the case of primary input A of macro 22A, this list will contain signals a, t and u. In step 118, each entry in the list is assigned a label according to where the signal originates or terminates: signals originating/terminating in a primary input/output are labeled PI, PO, respectively; signals originating/terminating in a latch input/output are labeled LI, LO respectively; signals in-between combinatorial logic elements 4 are labeled as internal (int). Signals in the list pertaining to input A of macro 22A are thus labeled a(PI), t(LI) and u(LI). Subsequently, the next primary input/output of macro 22A is investigated, say primary input B, which is found to encompass signals b(PI), t(LI) and u (LI). By iterating loop 120, all primary inputs A-E and all primary outputs F-H of macro 22A are inspected, and all signals encountered between these inputs/outputs A-H and latches 3 of macro 22A are assigned a label as described above. Note that signals may carry multiple labels: for example, signal e originating from primary input E is labeled e(PI)(LI) since it originates from primary input E and terminates in a latch 3 input.

Once all PI/PO of macro 22A have been classified in this way, signals used in a given logic function, including the resulting signals, are grouped together into signal cones (step 124). For example, signals originating from primary inputs A and B of macro 22A coincide in the sense that they encounter the same logic elements 4', 4'' and thus overlap with respect to signals u and t. These partially coinciding signals are grouped together to form a common signal cone 34, so that all signals collected in conjunction with signals originating from primary inputs A and B of macro 22A define signal cone 34A-1. Analogously, signals originating from primary inputs C and D of macro 22A are found to coincide and define signal cone 34A-2. Additional signal cones 34A-3 to 34A-6 are constructed accordingly. Table 1A shows the resulting labeling of signals and resulting signal cones obtained when parsing macro 22A of FIG. 6A.

TABLE 1A

Combinatorial signal cones of macro 22A

| Signal | PI | PO | LI | LO | Signal cone # |
|--------|----|----|----|----|---------------|
| a      | X  |    |    |    | 34A-1         |
| t      |    |    | X  |    |               |
| b      | X  |    |    |    |               |
| u      |    |    | X  |    |               |
| c      | X  |    |    |    | 34A-2         |
| i      |    |    | X  |    |               |
| d      | X  |    |    |    |               |
| e      | X  |    | X  |    | 34A-3         |
| f_q    |    | X  |    | X  | 34A-4         |
| g_q    |    | X  |    | X  | 34A-5         |
| h      |    | X  |    |    | 34A-6         |
| r_q    |    |    |    | X  |               |
| s_q    |    |    |    | X  |               |

Figure 8A:
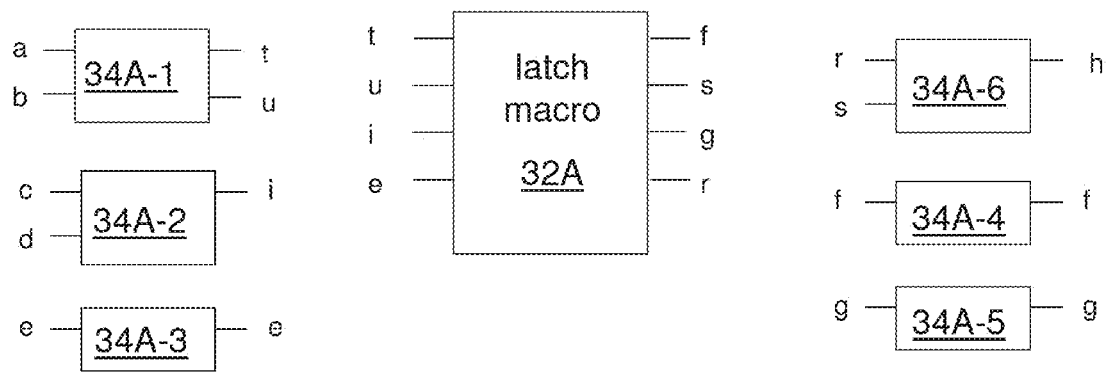
FIG. 8A is a decomposition of macro 22A of FIG. 6A into a latch macro 32A and multiple signal cones 34A.
Figure 7B:
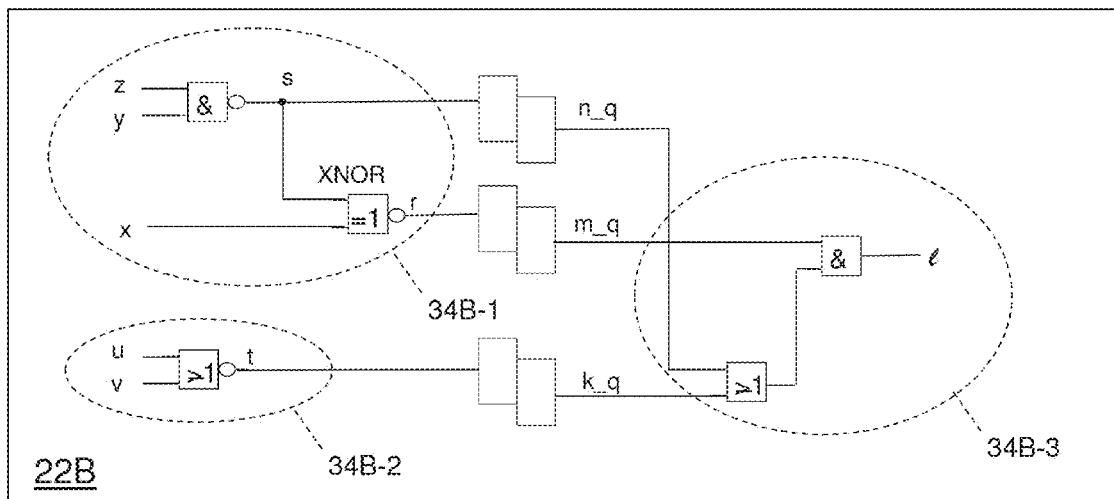
FIG. 7B is macro 22B of FIG. 6B, with signal cones indicated by circles.

All signal cones 34A-1 to 34A-6 shown in Table 1A are separated out from the VHDL description of macro 22A (step 125); after performing this separation, the remainder of macro 22A forms latch macro 32A. Signal cones 34A-1 to 34A-6 formed by extracting combinatorial logic along shared signal paths are indicated as hashed ovals in FIG. 7A. FIG. 8A shows the decomposition of macro 22A into latch macro 32A and signal cones 34A-1 to 34A-6. Dissecting step 110 as applied to macro 22A thus yields macro VHDL representations of latch macro 32A as well as macro VHDL representations of signal cones 34A-1 to 34A-6.

Subsequently, macro 22B of design unit 21 under consideration is evaluated analogously as described above for macro 22A. Table 1B shows the labels of signals and signal cones obtained when parsing macro 22B of FIG. 6B.

TABLE 1B

Combinatorial signal cones of macro 22B

| Signal | PI | PO | LI | LO | Signal cone # |
|--------|----|----|----|----|---------------|
| z      | X  |    |    |    | 34B-1         |
| r      |    |    | X  |    |               |
| s      |    |    | X  |    |               |
| x      | X  |    |    |    |               |
| y      | X  |    |    |    |               |
| v      | X  |    |    |    | 34B-2         |
| t      |    |    | X  |    |               |
| u      | X  |    |    |    |               |
| l      |    | X  |    |    | 34B-3         |
| m_q    |    |    |    | X  |               |
| n_q    |    |    |    | X  |               |
| k_q    |    |    |    | X  |               |

Figure 8B:
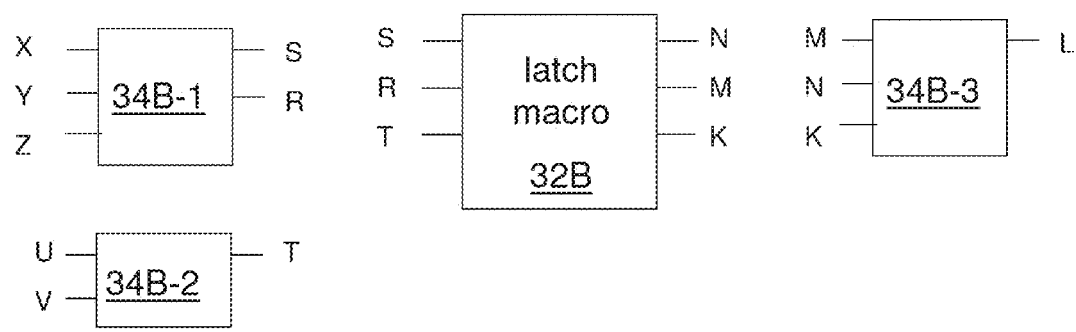
FIG. 8B is a decomposition of macro 22B of FIG. 6B into a latch macro 32B and multiple signal cones 34B.

Following the steps outlined above, three signal cones 34B-1 to 34B-3 are identified for macro 22B (step 124) and are separated out from the VHDL description of macro 22A (step 125). The remainder of macro 22B, after performing this separation, form latch macro 32B. Signal cones 34B-1 to 34B-3 formed by extracting combinatorial logic elements located along common signal paths are indicated as hashed ovals in FIG. 7B. FIG. 8B shows the decomposition of macro 22B into latch macro 32B and signal cones 34B-1 to 34B-3. Dissecting step 110 as applied to macro 22B thus yields macro VHDL representations of latch macro 32B and signal cones 34B-1 to 34B-3.

If unit 21 contains more macros 22, these will be evaluated one by one—as described above—by iterating loop 130 of FIG. 4a. During this parsing process of macros 22, all signals entering primary inputs and exiting primary outputs of the macros 22 are checked and classified (loop 120), combined into signal cones 34 and separated out from the macro VHDL description of macro 22, thus decomposing the VHDL description of macro 22 into macro VHDL code of a latch macro 32 and of multiple signal cones 34.

If the macro 22 to be partitioned is found to contain no latches 3 but only combinatorial logic (as is the case, for example, with macro 2C shown in FIG. 1), none of its signals will be labeled either LI or LO in step 118. Thus, all signals traversing this macro will be grouped into one signal cone 34, no latch macro will be generated, and the VHDL description of this macro will not be altered in any way in step 110. If there are several POs, several cones will be generated but may form one combinatorial macro 34. Note that the combinatorial logic does not only consist of independent cones, but that cones may overlap.

Figure 9:
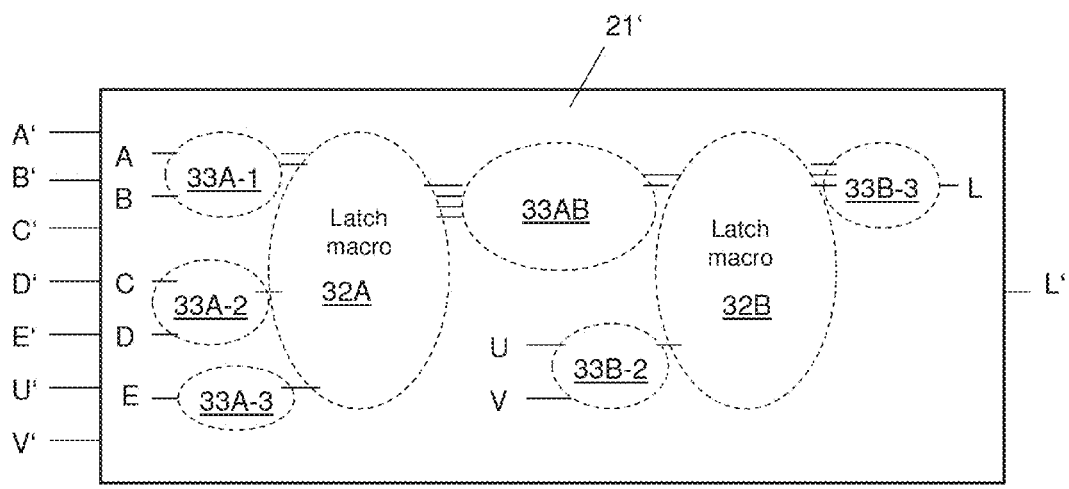
FIG. 9 is the result of a repartition of design unit of FIG. 5 in terms of latch macros 32A, 32B and combinatorial macros 33.
Figure 6A:
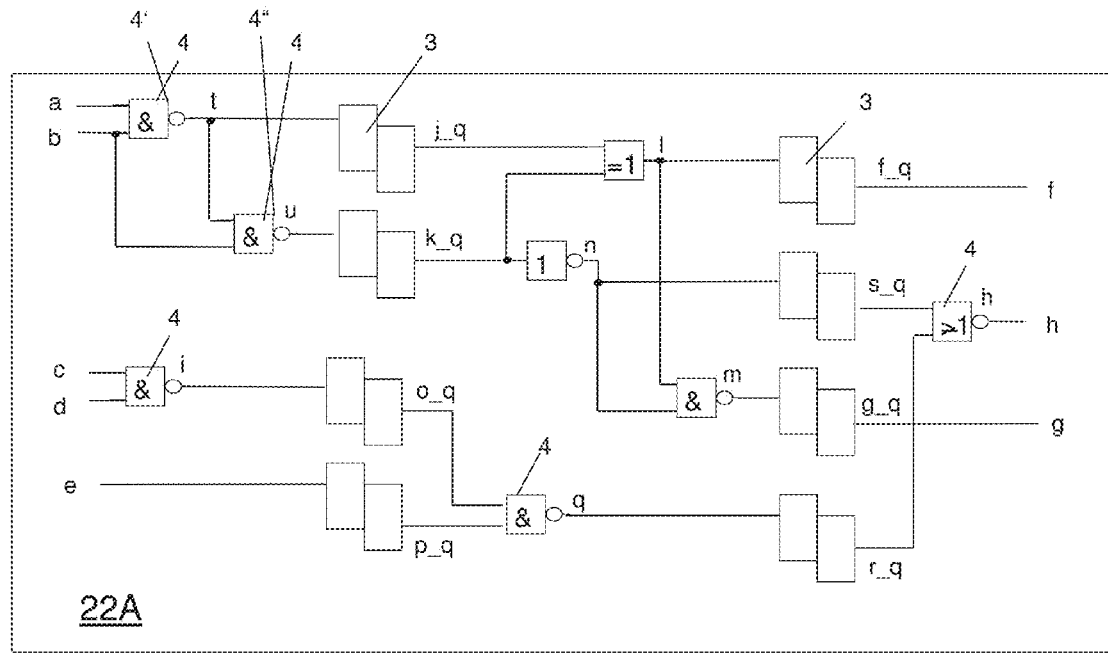
FIG. 6A is a schematic representation of macro 22A of FIG. 5.
Figure 6B:
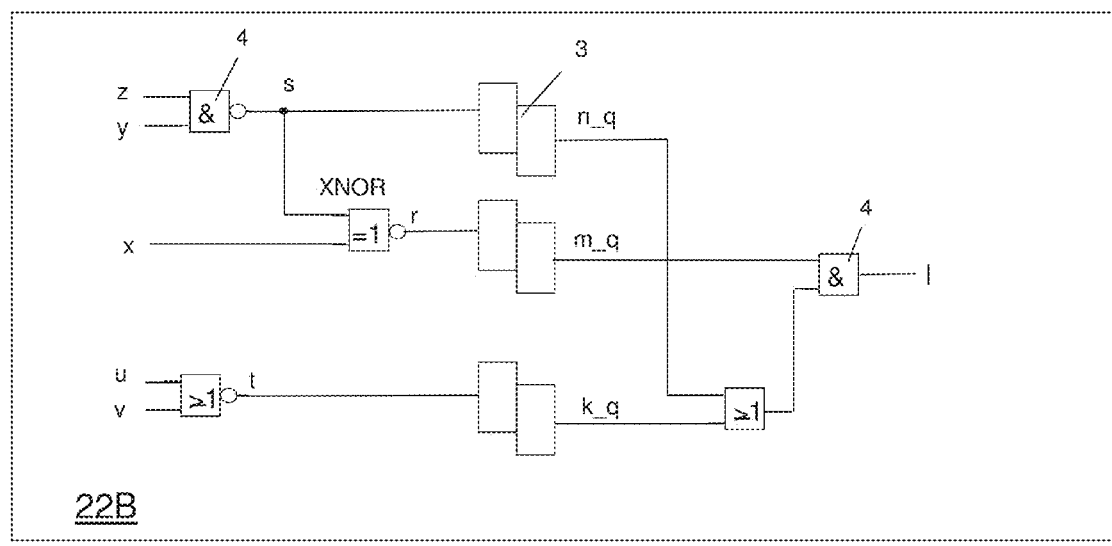
FIG. 6B is a schematic representation of macro 22B of FIG. 5.
Figure 7A:
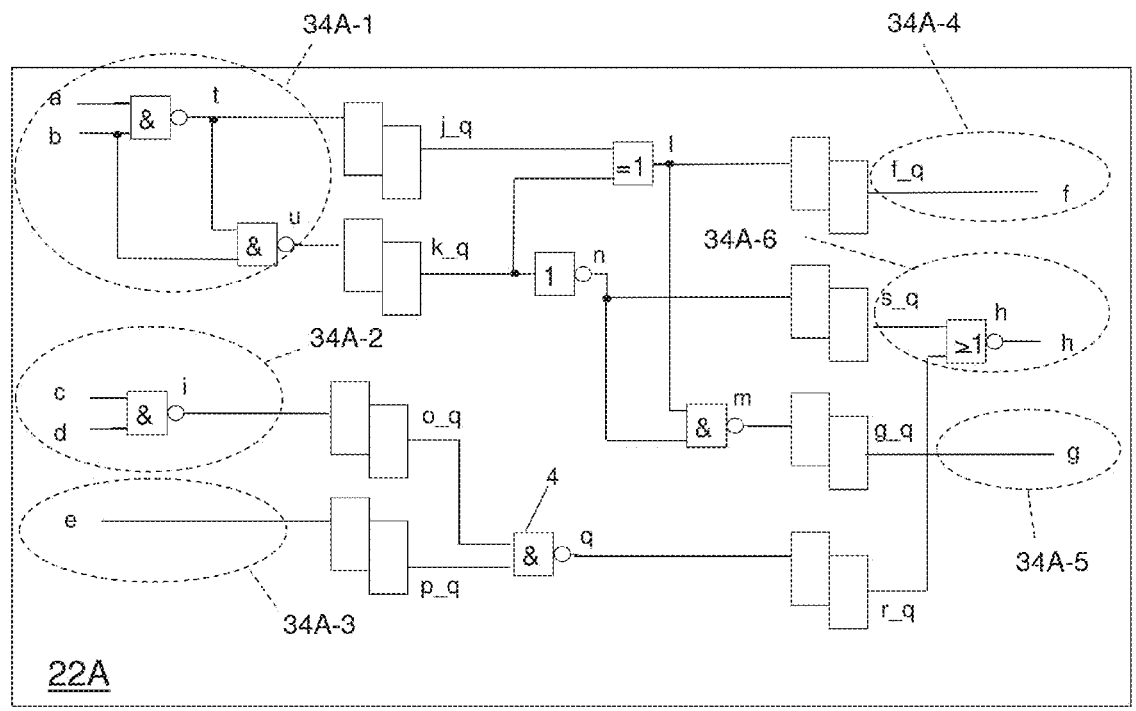
FIG. 7A is macro 22A of FIG. 6A, with signal cones indicated by circles.

Once all macros 22 within the electronic circuit design unit 21 have been decomposed in terms of latch macros 32 and signal cones 34 in dissecting step 110, the unit VHDL representation of the unit 1 is checked for macro connectivity (step 132). In the example of FIG. 5, the unit VHDL representation of unit 21 contains information on how primary outputs of macro 22A are connected to primary inputs of macro 22B. This information can be used to merge selected signal cones 34A of macro 22A with signal cones 34B of macro 22B, thus generating combinatorial macros 33 comprising multiple signal cones 34. In particular, signal cones 34A-4, 34A-5 and 34A-6 originating from macro 22A can be merged with signal cone 34B-1 originating from macro 22B to yield a combinatorial macro 33AB (steps 134 and 136). Macro VHDL descriptions are generated for all combinatorial macros 34 thus generated. The remaining signal cones 34A-1, 34A-2, 34A-3, 34B-2 and 34B-3 cannot be merged with other signal cones and thus correspond directly to combinatorial macros 33A-1, 33A-2, 33A-3, 33B-2 and 33B-3. All of the combinatorial macros 33 thus generated, in conjunction with the latch macros 32, yield a new VHDL description of the electronic design unit 21' (step 138). A schematic representation of repartitioned unit 21' in terms of latch macros 32A, 32B and combinatorial macros 33A-x, 33B-x, 33AB is depicted in FIG. 9.

Note that the repartition of the electronic design unit 21 in terms of latch macros 32 and combinatorial macros 33 does not necessarily require a VHDL representation of the design unit 21. Rather, method 100 may start from a netlist representation of the design unit 21, provided that the netlist is comprehensive in the sense that it contains information on the position of the latches 3 with respect to the PI/POs of the macros 22.

Figure 10:
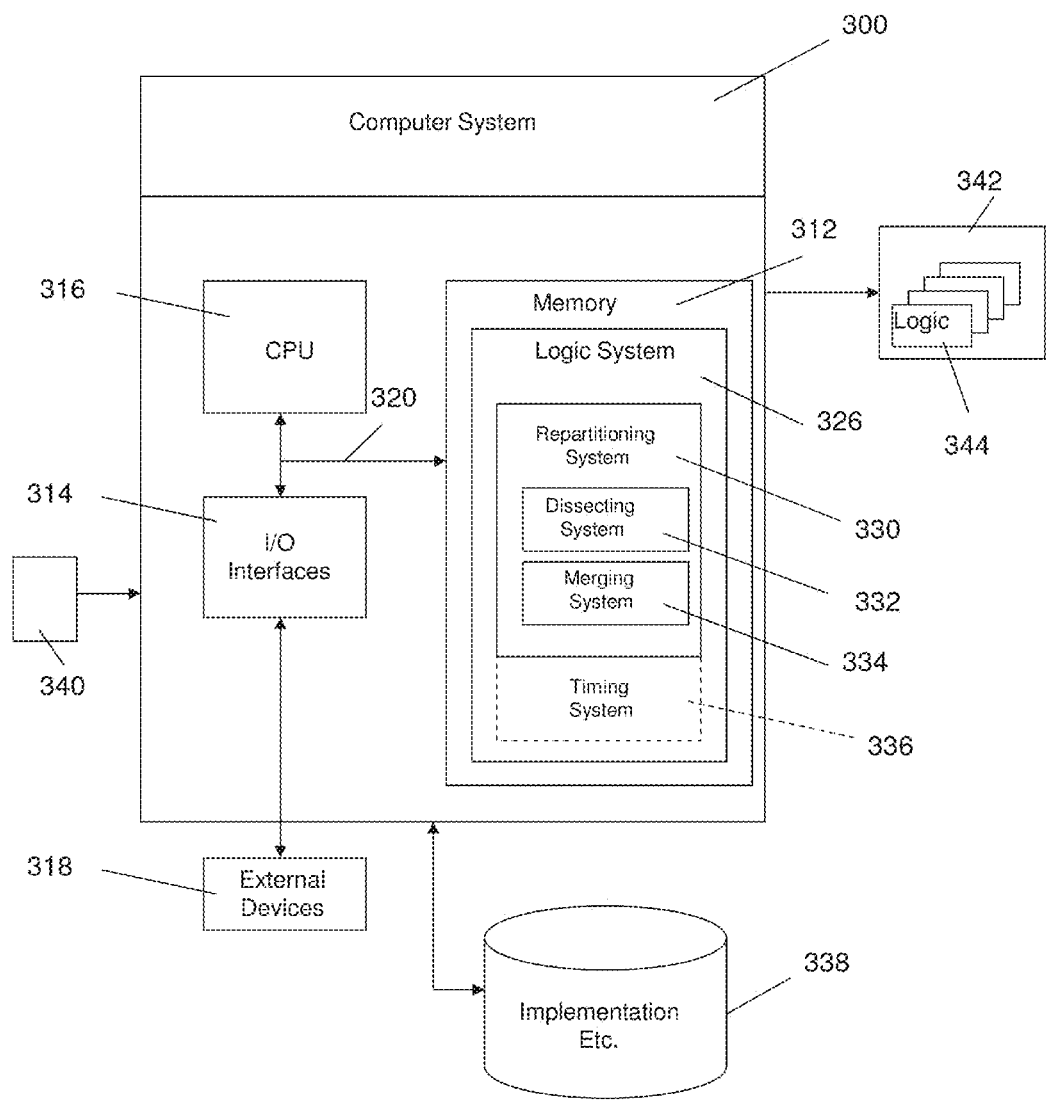
FIG. 10 is a computer system implementation of the present invention.

Referring now to FIG. 10, a computer system 300 implementation of the preferred embodiment of the present invention is shown. Specifically, the present invention can be implemented as a computer system 300 and/or program product for repartitioning a hierarchical description of an electronic design unit 1, 21 with a plurality of macros 2, 22 in terms of combinatorial macros 13, 33 containing only combinatorial logic and latch macros 12, 32 containing one or several latches 3, each primary input PI and output PO of said latch macro 12, 32 coinciding with an input or an output of a latch 3 within said latch macro 12, 32.

This allows user 340 to create a repartitioned design unit 1' 21' which lends itself to efficiently generating timing assertions with reduced manual interference. As depicted, computer system 300 generally comprises memory 312, input/output (I/O) interfaces 314, a central processing unit (CPU) 316, external devices/resources 318, bus 320 and data base 338. Memory 312 may comprise any known type of data storage and/or transmission media, including magnetic media, optical media, random access memory (RAM), read-only memory (ROM), a data cache, a data object etc. Moreover, memory 312 may reside at a single physical location, comprising one or more types of data storage, or can be distributed across a plurality of physical systems in various forms. CPU 316 may likewise comprise a single processing unit, or be distributed across one or more processing units in one or more locations, e.g. on a client and server.

I/O interfaces 314 may comprise any system for exchanging information from an external source. External devices 318 may comprise any known type of external device, including keyboard, mouse, voice recognition system, printer, monitor, facsimile etc. Bus 320 provides a communication link between each of the components in the computer system 300 and likewise may comprise any known type of transmission link, including electrical, optical, wireless etc. In addition, although not shown, additional components such as cache memory, communication systems, system software etc. may be incorporated into computer system 300.

Database 338 provides storage for information necessary to carry out the present invention. Such information could include, inter alia: (1) unit and macro VHDL code; (2) wiring and buffering information; (3) nominal delay rules etc. Database 338 may include one or more storage devices, such as a magnetic disk drive or an optical disk drive. In another embodiment, database 338 includes data distributed across, for example, a local area network (LAN), wide are network (WAN) or a storage area network (SAN) (not shown in FIG. 10). Database 338 may also be configured in such a way that one of ordinary skill in the art may interpret it to include one or more storage devices. Moreover, it should be understood that database 338 could alternatively exist within computer system 300.

Stored in memory 312 is logic system 326. As depicted, logic system 326 generally includes repartitioning system 330 and may also include a timing system 336 for generating and verifying timing assertions on the repartitioned design unit 21'. In a preferred embodiment of the invention, repartitioning system 330 comprises dissecting system 332 and merging system 334. The systems shown herein carry out the functions described above.

Repartitioning system 330 will repartition the macro structure of original design unit 21 with macros 22 into a repartitioned design unit 21' with latch macros 32 and combinatorial macros 33. Dissecting system 332 of repartitioning system 330 will split macros 22 into signal cones 34 (linking macro PI/PO to macro latches) and latch macros 32 (whose primary inputs and outputs coincide with latch 3 inputs or latch 3 outputs). Merging system 334 will create combinatorial macros 33 by merging signal cones 34 along unit signal paths. Timing system may be used for generating timing assertions on the repartitioned design unit 21'. The generation and verification of timing assertions may be carried out separately and thus is denoted by a dashed box in FIG. 10.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The invention claimed is:

1. A method for repartitioning a multilevel hierarchical description of a design unit comprising a plurality of macros, the method comprising the steps of:
   dissecting each macro of an original hierarchical design into combinational logic, latches and data signal cones, said data signal cones linking inputs of a first latch macro through one or more combinational logic macros to outputs of a second latch macro, wherein each latch macro comprises at least one latch, each input and output of each latch macro coinciding with an input or an output of a latch within said latch macro, and wherein a combinational logic macro comprises at least one logic gate; and
   creating, using a data processing system, a new hierarchical design by moving combinational logic from a latch macro to a combinational logic macro, said new hierarchical design having the same data signal cones as said original hierarchical design.

2. The method of claim 1, wherein said multilevel hierarchical description of said design unit is described in VHDL.

3. The method of claim 1, wherein said multilevel hierarchical description of said design unit is embodied in a netlist.

4. The method of claim 3, further including:
   identifying all data signals logically connected to inputs and outputs of said first and second latch macros and said combinational logic macros of said original hierarchical design; and
   grouping said data signals into said signal cones according to functional affiliation.

5. A data processing system for generating and verifying timing assertions for a design unit, comprising:
   a repartition system for generating a repartitioned design unit in terms of latch macros and combinatorial macros, said repartition system configured to:
      dissect each macro of an original hierarchical design of said design unit into combinational logic, latches and data signal cones, said data signal cones linking inputs of a first latch macro through one or more combinational logic macros to outputs of a second latch macro, wherein each latch macro comprises at least one latch, each input and output each latch macro coinciding with an input or an output of a latch within said latch macro, and wherein a combinational logic macro comprises at least one logic gate; and
      create a new hierarchical design by moving combinational logic from a latch macro to a combinational logic macro, said new hierarchical design having the same data signal cones as said original hierarchical design; and
   a timing system for generating timing assertions on said repartitioned design unit.

6. The data processing system of claim 5, wherein transfer time delays between said first latch macro and said second latch macro in said new hierarchical design are the same as in said original hierarchical design.

7. The data processing system of claim 5, wherein said original hierarchical design of said design unit is described in VHDL.

8. The data processing system of claim 5, wherein said original hierarchical design of said design unit is embodied in a netlist.

9. A data processing repartitioning system for repartitioning a multilevel hierarchical description of a design unit, comprising
   a dissecting system for dissecting all macros into latch macros and signal cones, said dissecting system configured to dissect each macro of an original hierarchical design of said design unit into combinational logic, latches and data signal cones, said data signal cones linking inputs of a first latch macro through one or more combinational logic macros to outputs of a second latch macro, wherein each latch macro comprises at least one latch, each input and output each latch macro coinciding with an input or an output of a latch within said latch macro, and wherein a combinational logic macro comprises at least one logic gate; and
   a merging system for creating combinatorial macros, said merging system configured to create a new hierarchical design by moving combinational logic from a latch macro to a combinational logic macro, said new hierarchical design having the same data signal cones as said original hierarchical design.

10. The data processing repartitioning system of claim 9, wherein transfer time delays between said first latch macro and said second latch macro in said new hierarchical design are the same as in said original hierarchical design.

11. The data processing repartitioning system of claim 9, wherein said multilevel hierarchical description of said design unit is described in VHDL.

12. The data processing repartitioning system of claim 9, wherein said multilevel hierarchical description of said design unit is embodied in a netlist.

13. A computer program product comprising a computer useable storage device including a computer readable program, wherein the computer readable program when executed on a computer causes the computer to:
   generate a multilevel hierarchical description of a design unit in terms of macros;
   dissect each macro of an original hierarchical design of said design unit into combinational logic, latches and data signal cones, said data signal cones linking inputs of a first latch macro through one or more combinational logic macros to outputs of a second latch macro, wherein each latch macro comprises at least one latch, each input and output each latch macro coinciding with an input or an output of a latch within said latch macro, and wherein a combinational logic macro comprises at least one logic gate;

create a new hierarchical design of said design unit by moving combinational logic from a latch macro to a combinational logic macro, said new hierarchical design having the same data signal cones as said original hierarchical design; and generate timing assertions on said new hierarchical design.

14. A computer program product comprising a computer useable storage device including a computer readable program, wherein the computer readable program when executed on a computer causes the computer to:

dissect each macro of an original hierarchical design into combinational logic, latches and data signal cones, said data signal cones linking inputs of a first latch macro through one or more combinational logic macros to outputs of a second latch macro, wherein each latch macro comprises at least one latch, each input and output each latch macro coinciding with an input or an output of a latch within said latch macro, and wherein a combinational logic macro comprises at least one logic gate; and create a new hierarchical design by moving combinational logic from a latch macro to a combinational logic macro, said new hierarchical design having the same data signal cones as said original hierarchical design and wherein transfer time delays between said first latch macro.

15. The program product of claim 13, wherein said multi-level hierarchical description of said design unit is described in VHDL.

16. The program product of claim 13, wherein said multi-level hierarchical description of said design unit is embodied in a netlist.

17. The program product of claim 14, wherein transfer time delays between said first latch macro and said second latch macro in said new hierarchical design are the same as in said original hierarchical design.

18. The program product of claim 14, wherein said original hierarchical design is described in VHDL.

19. The program product of claim 14, wherein said original hierarchical design is embodied in a netlist.

* * * * *